(12) United States Patent
Bourgeau et al.

(10) Patent No.: US 9,825,457 B2
(45) Date of Patent: Nov. 21, 2017

(54) BREAKER DESIGN FOR POWER SYSTEM RESILIENCY

(71) Applicants: Transocean Sedco Forex Ventures Limited, George Town Grand Cayman (KY); Aspin Kemp & Associates Holding Corp., Owen Sound (CA)

(72) Inventors: Edward Peter Kenneth Bourgeau, Houston, TX (US); Jason Aspin, Charlottetown (CA)

(73) Assignees: Transocean Sedco Forex Ventures Limited, George Town Grand (KY); Aspin Kemp & Associates, Owen Sound (Ontario) (CA)

( * ) Notice: Subject to any disclaimer, the term of this patent is extended or adjusted under 35 U.S.C. 154(b) by 52 days.

(21) Appl. No.: 14/210,346

(22) Filed: Mar. 13, 2014

(65) Prior Publication Data

US 2014/0268430 A1    Sep. 18, 2014

Related U.S. Application Data

(60) Provisional application No. 61/779,391, filed on Mar. 13, 2013.

(51) Int. Cl.
| | |
|---|---|
| *H02H 3/05* | (2006.01) |
| *H02H 7/22* | (2006.01) |
| *H02H 11/00* | (2006.01) |
| *H02J 13/00* | (2006.01) |
| *H02H 3/06* | (2006.01) |
| *H02H 7/28* | (2006.01) |

(Continued)

(52) U.S. Cl.
CPC .............. *H02H 7/22* (2013.01); *H02H 3/066* (2013.01); *H02H 7/28* (2013.01); *H02H 11/005* (2013.01); *H02J 13/0006* (2013.01); *H02H 3/00* (2013.01); *H02H 3/04* (2013.01); *H02H 3/05* (2013.01); *H02H 3/162* (2013.01)

(58) Field of Classification Search
CPC .............................. H02H 7/22; H02H 11/005
See application file for complete search history.

(56) References Cited

U.S. PATENT DOCUMENTS

| | | | | |
|---|---|---|---|---|
| 3,936,727 A | * | 2/1976 | Kelley, Jr. ............ | G01R 15/142 323/210 |
| 4,453,191 A | | 6/1984 | Wilkinson | |

(Continued)

FOREIGN PATENT DOCUMENTS

| | | |
|---|---|---|
| CN | 101341566 A | 1/2009 |
| EP | 637866 A1 | 2/1995 |

(Continued)

*Primary Examiner* — Shawki S Ismail
*Assistant Examiner* — Muhammad S Islam
(74) *Attorney, Agent, or Firm* — Norton Rose Fulbright US LLP

(57) ABSTRACT

An autonomous breaker can apply a current through a high impedance source to a bus coupled to either end of a breaker in order to measure an impedance of the bus. The status of the bus can be determined from the measurement. Based on the determined status, a fault detection procedure can be selected and implemented to determine if a fault exists on the bus. When the fault detection procedure has been implemented and no fault has been detected, the breaker can close, and thus couple the bus to another bus.

19 Claims, 11 Drawing Sheets

(51) Int. Cl.
*H02H 3/00* (2006.01)
*H02H 3/04* (2006.01)
*H02H 3/16* (2006.01)

(56) References Cited

U.S. PATENT DOCUMENTS

| | | | |
|---|---|---|---|
| 6,107,927 | A | 8/2000 | Dvorsky et al. |
| 6,285,533 | B1* | 9/2001 | Sakamoto ............ H02H 7/06 361/23 |
| 7,995,315 | B2 | 8/2011 | Riley et al. |
| 2004/0019410 | A1* | 1/2004 | Papallo ............ G06F 1/12 700/292 |
| 2009/0254297 | A1* | 10/2009 | Bengtsson ............ G01R 27/16 702/117 |
| 2011/0075304 | A1* | 3/2011 | Hamer ............ H02H 7/263 361/47 |
| 2011/0084672 | A1* | 4/2011 | Labuschagne ........ H02J 3/1878 323/255 |
| 2011/0085273 | A1* | 4/2011 | Bengtsson ............ H02H 3/06 361/65 |
| 2012/0019965 | A1* | 1/2012 | Faxvog ............ H02H 3/52 361/42 |
| 2012/0063039 | A1* | 3/2012 | Shah ............ H02H 7/261 361/20 |
| 2014/0001886 | A1* | 1/2014 | Singireddy ............ H02J 3/24 307/127 |

FOREIGN PATENT DOCUMENTS

| | | |
|---|---|---|
| EP | 1734632 A2 | 12/2006 |
| EP | 1744428 A2 | 1/2007 |
| EP | 2442417 A1 | 4/2012 |
| JP | 2000037039 A | 2/2000 |
| JP | 200347156 A | 2/2003 |
| JP | 200374142 A | 3/2003 |
| JP | 2005012938 A | 1/2005 |
| NO | 2007047615 A2 | 4/2007 |
| WO | 20120063039 A1 | 5/2012 |

* cited by examiner

BREAKER DESIGN FOR POWER SYSTEM RESILIENCY

CROSS REFERENCE TO RELATED APPLICATIONS

This applications claims the benefit of priority to U.S. Provisional Patent Application No. 61/779,391 to Edward Peter Kenneth Bourgeau filed Mar. 13, 2013 and entitled "Breaker Design for Power System Resiliency," which is hereby incorporated by reference.

TECHNICAL FIELD

This disclosure is related to power systems. More specifically, this disclosure is related to a resilient and fault tolerant breaker for power systems.

BACKGROUND

Resiliency is an important consideration in any power system, regardless of the application. The issues to which the power system must be resilient vary based on the application. For example, on an offshore drilling vessel, the power system should be made resilient to flooding, fires, or a fault within an electrical bus that carries power from generators to electrical devices throughout the vessel.

An electrical system on a vessel conventionally includes multiple generators in compartmentalized units that are separated against fire and flood. The compartmentalized units prevent damage from fire or flood to one unit from propagating to another compartmentalized unit. However, control systems for the power system are not located in the compartmentalized units. Further, the control system relies on information from each of the generators in each of the compartmentalized units to control the power system. For example, a control system can determine whether or not and when generators can couple to a main power distribution bus. Although the loss of a generator or a control system may not result in a loss of all generators or control systems, the generators and their control systems are unable to function independently and can suffer reduced performance or be further damaged due to incorrect decisions made by a control system.

A breaker couples a generator to a power bus and can break the connection between the power bus and the generator based on commands from a control system. Each breaker is linked by signal cables to other breakers, and the status of each breaker is included in the logic of the control section of the breakers. Consequently, damage to a breaker in one compartment creates erroneous behavior in a breaker in another compartment. Thus, the overall resiliency of the power system is reduced. Each breaker may include logic that controls the breaker either in the same cabinet or external to the cabinet.

FIG. 1 is a schematic representation of a conventional method for using breakers 112, 114, 116 within a power system 100, such as in offshore drilling vessels. The breakers 112, 114, 116 are coupled between a main electrical bus 102 and generators 122, 124, 126, respectively. Barriers 150 may be placed between the generators 122, 124, and 126 to isolate operation of the generators 122, 124, and 126 should a fire, flood, or other catastrophe occur. Communication links 113, 115 couple the breakers 112, 114, 116 to each other. The breakers 112, 114, 116 also share a control power cable 199 used to provide power to the breakers 112, 114, 116. The main bus 102 can be connected as a single conductor or broken into multiple segments by tie breaker master/slave sets 151, 152 and 153, 154. Communication links 156, 157 couple the tie breaker sets 151, 152 and 153, 154, respectively, to each other. The tie breaker master/slave sets 151, 152 and 153, 154 also share a control power cable 199 used to provide power to the tie breaker master/slave sets 151, 152 and 153, 154.

The generator breakers 112, 114, 116 communicate the status of the generators 122, 124, and 126 over the communication links 113 115, 131. Logic within each of the breakers 112, 114, 116 is dependent upon the behavior of each of the other breakers 112, 114, 116. For example, if the breaker 112 is instructed to perform synchronization with the main bus 102, then the breaker 112 must first indicate to the breaker 114 not to perform synchronization, or vice versa. If breaker 114 indicates it is performing a synchronization, no other breaker can perform a synchronization even if such indication is faulty. Therefore, if a communication link 131, 132, 133 between the management system 130 and the generator breakers 112, 114, 116 fails or if the any breaker 112, 114, 116 itself fails, then access to the other healthy breakers is interrupted.

Additional communications links may be provided between the management system 130 and the breakers 112, 114, 116, respectively. However, the additional communications links increase complexity of the system 100 and the number of connections that must be made between barriers 150. Decisions to open and/or close the breakers 112, 114, and 116 may be made by the management system 130 based on input from a bus sensing units 140, 143, 144 coupled to the main bus 102. Communication is required between bus sensing units 140, 143, 144 and the management system 130 and between generator breakers 112, 114, and 116. Communication is required between bus sensing units 140, 143 and the tie breakers 151, 152 and communication is required between bus sensing units 143, 144 and the tie breakers 153, 154. These communications links increase complexity of the system 100 and the number of connections that must be made between barriers 150. Successful operation of the tie breakers sets 151, 152 and 153, 154 require communications between the tie breaker master 151 and its slave 152 and between the tie breaker master 153 and its slave 154. These communications links increase complexity of the system 100 and the number of connections that must be made between barriers 150. Furthermore, an operator using a management system 130 can communicate only to the master breaker 151 or 153 of the tie breaker sets 151, 152 and 153, 154. Therefore, if a communication link 134, 135 between the management system 130 and the master breaker 151 or 153, respectively, fails or if the master breaker 112 itself fails, then access to the other breaker 152, 154 is interrupted.

Two issues arise from the network of interconnected breakers 110 that can affect the resiliency of the power system 100. First, the breaker 112, 113, 114, 151, 152, 153, 154 can close onto the bus 102 when the bus 102 is unsuitable for receiving additional power from the generator 122, 124, 126 such as when there is a fault on bus 102, such as a ground or a short circuit or a fault caused by the incorrect connection of a faulty generator. Second, the network of interconnected breakers 110 lacks autonomy of operation, because the breakers 112, 113, 114, 151, 152, 153, 154 are reliant on data from each other to control the supply of power to the bus 102.

One conventional solution to improving resiliency is the use of barriers 150. The consequences of a fire or flood are limited by use of barriers 150. However, the fire or flood in a specific compartment will disturb the signals that cross the barrier 150. This can cause erroneous data to be passed to the compartments protected by barrier 150. The consequences erroneous data can disable or otherwise compromise the operation of the equipment in a compartment that has not been damaged by a fire or flood.

BRIEF SUMMARY

Reducing the reliance of a breaker on input from other breakers can improve the resiliency of a power system. For example, each breaker can independently execute a method for determining when a breaker is safe to close. Providing each breaker with the capability to independently execute such a method can reduce or eliminate reliance of each breaker on other breakers. The improved resiliency of a power system employing the autonomous breakers may result from a lower likelihood that one breaker operating erroneously can cause all breakers to operate erroneously. Thus, a power system can continue to operate normally even though one breaker may become inoperable.

According to one embodiment, a method for determining when to close a breaker includes applying a current to a first bus coupled to a breaker. The method may also include measuring a first impedance of the first bus after applying the first current to the first bus in order to determine if a fault exists on the first bus. If no fault is determined to exist on the first bus, the method may further include coupling the first bus to a second bus coupled to the breaker.

The method can include applying the current to the first bus through a potential transformer. The method can be initiated by receiving a command, at a controller, to close the breaker. Furthermore, the method can include checking the status of the first bus and instructing, by a controller, a contactor coupled to a sensor to either close or open. The sensor can be a voltage sensor, a current sensor, or both a voltage and current sensor.

According to an embodiment, the method can also include determining a fault detection procedure to implement based, in part, on the measured first impedance of the first bus. The method can also include processing the measured first impedance of the first bus in order to determine the status of the bus. Instructions within a controller can be executed to select the fault detection procedure to implement based, in part, on the determined status of the first bus.

The method can include instructing, by a controller, a contactor coupled to the sensor to close or open when implementing the selected fault detection procedure. A second current can be applied to the first bus in order to measure a second impedance of the first bus. The second measured impedance can be processed by a controller to determine whether a fault exists on the first bus.

According to an embodiment, the measuring of the impedance of a bus can be performed by measuring a voltage, a current, or both a voltage and a current of the bus. Furthermore, the coupling of the first bus to at least a second bus can be performed by first synchronizing the first bus to a second bus, and then closing the breaker between the first and the second bus. Moreover, the coupling of the first bus to the second bus can result in the coupling of a generator to a load on a drilling vessel.

According to another embodiment, an apparatus includes a breaker coupled between a first and a second bus. The apparatus also includes a controller coupled to the breaker that allows the apparatus to operate autonomously. The controller can be configured to apply the first current to the first bus coupled to the breaker. The controller can also be configured to measure a first impedance of the first bus, and to determine if a fault exists on the first bus. The apparatus can also include at least one potential transformer coupled to the controller and the first bus and at least one other potential transformer coupled to the controller and the second bus.

The apparatus can also include devices that protect, such as a protection circuit coupled to the breaker and an external protection system, or devices that control the internal components of the breaker, such as an operator interface. The apparatus can also include a device for performing measurements on the breaker, such as a universal measuring transducer, coupled to the controller and to an external bus. Furthermore, the apparatus can include synchronization circuitry, such as a synchronizer coupled to an external power source. Other synchronization circuitry can include a sync check relay coupled to the operator interface and to an external power source control circuit. The protection circuit, universal measuring transducer, synchronizer, sync check relay, and/or the controller can be part of a control circuit within the apparatus.

According to an embodiment, the controller can be further configured to control the apparatus autonomously and to manage control commands. The controller can also be configured to monitor and control the status of switchgear, and to determine the status of the breaker. Moreover, the controller can be configured to control the process by which potential transformers are coupled, and to monitor voltage and current existing on a bridge between potential transformers.

According to an embodiment, the controller can be further configured to autonomously detect the status of the bus and determine based on bus status only the requirement to connect or remove generators from the bus without participation from a central control system. Bus status, in addition to faults such as grounding or short circuit, would include such conditions as an overload under-load, of either real or reactive power. The apparatus may operate autonomously and to manage control commands to open and/or close a breaker. Based on bus status, the controller can also be configured to monitor and control the status of switchgear, and to determine the status and control the breaker.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Resiliency within a power system can be improved by reducing reliance of components in one compartment on components in other compartments. According to one embodiment, reliance can be reduced by reducing the amount of communication between components. For example, a breaker can include logic that executes methods with little or no input from other breakers. This improves the resiliency of the power system, because each breaker in a compartment can continue operating while another breaker is erroneously behaving in another compartment. Furthermore, each breaker can communicate directly to the management system. Therefore, the breaker can receive instructions, such as whether to open or close a breaker, without relying on other breakers to receive the instructions.

According to an embodiment, a high energy collision on a main power distribution bus can be prevented by testing the status of a bus, such as through the use of high impedance potential transformers that reduce the energy in a collision on the bus. The high energy collision can result from different breakers that couple different unsynchronized generator buses to a main power distribution bus closing at the same time onto the distribution bus, which can be dead at the time. A low energy collision can be generated by the high impedance potential transformer and used to measure an impedance of the bus, identify the status of the bus, and to determine whether or not to close a breaker coupled to the bus. By performing this impedance sensing, and measuring the bus impedance, such as through transformers prior to closing the breaker, the breaker can ensure that a collision occurs through the transformers. This collision through the transformers can avoid a high energy bus-to-bus collision that could be damaging to the power system. Thus, the resiliency of the power system is further enhanced with a high impedance potential transformer.

Figure 1:
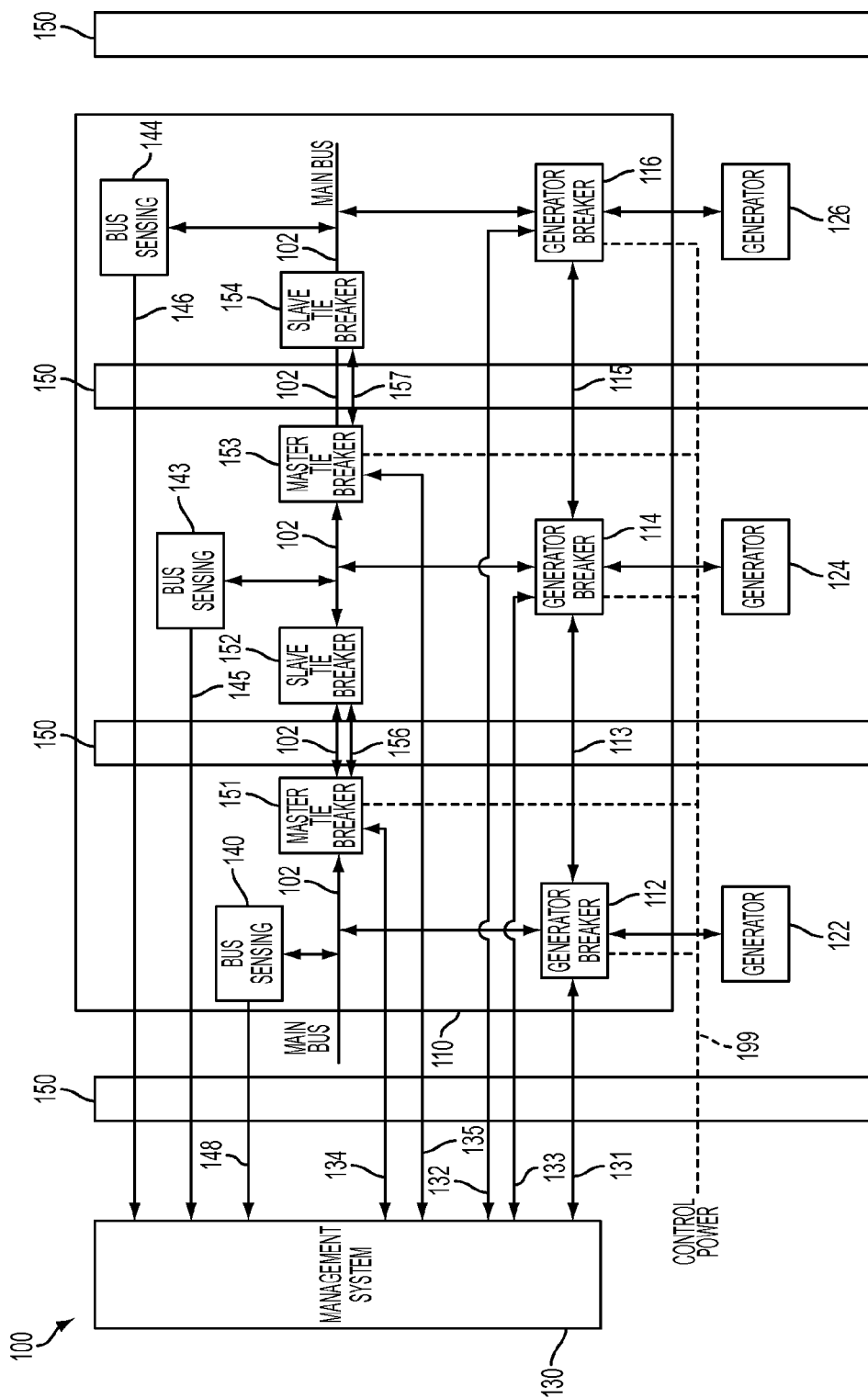
FIG. 1 is a schematic representation of a conventional breaker within a power system common on the current generation of offshore drilling vessels and standalone power plants.
Figure 2A:
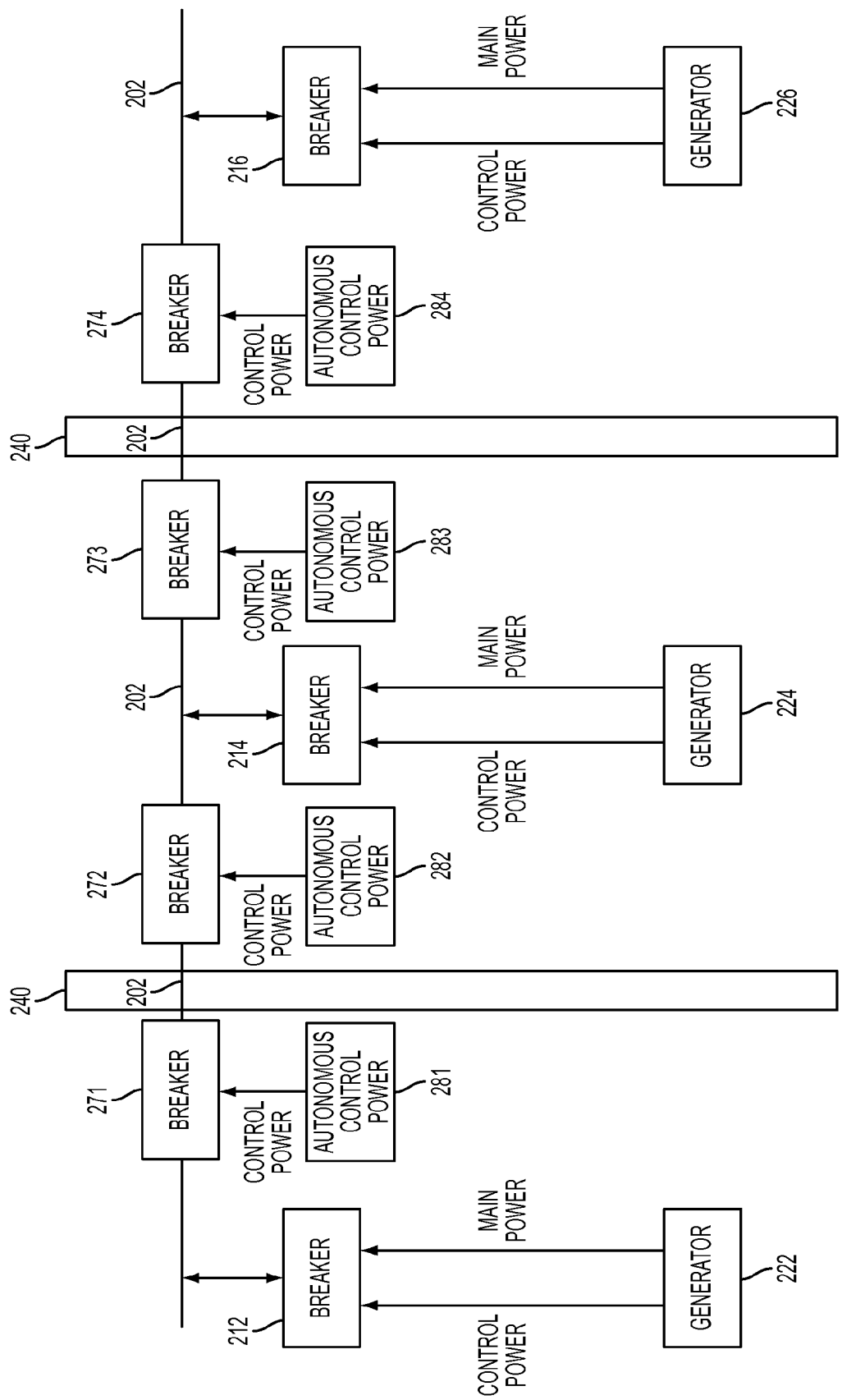
FIG. 2A is schematic representation of a power system with independent breakers according to one embodiment of the disclosure.

FIG. 2A depicts a schematic representation of a power system 200 with breakers 212, 214, 216 according to one embodiment of the disclosure. The breakers 212, 214, 216 may operate autonomously. Each of the breakers 212, 214, 216 may be provided power from the generators 222, 224, 226, respectively, through control power lines. According to one embodiment, the control power cable can be a low voltage DC bus.

In the power system 200, an erroneously operating breaker may not cause erroneous behavior in another breaker. Each breaker 212, 214, 216 can independently execute a method, using internal circuitry with little or no information from other breakers 212, 214, 216, to determine whether it is safe to close the breaker 212, 214, 216 and couple the generators 222, 224, 226, respectively, to the main power bus 202.

As described herein, "breakers" may include a generator breaker, such as breakers 212, 214, 216 between the generators 222, 224, 226 and the main power bus 202. "Breakers" may also include a tie breaker, such as breakers 271, 272, 273, 274 between segments of the power buses 202. Each of these breakers 271, 272, 273, 274 may be powered by autonomous control power 281, 282, 283, 284, respectively.

Figure 2B:
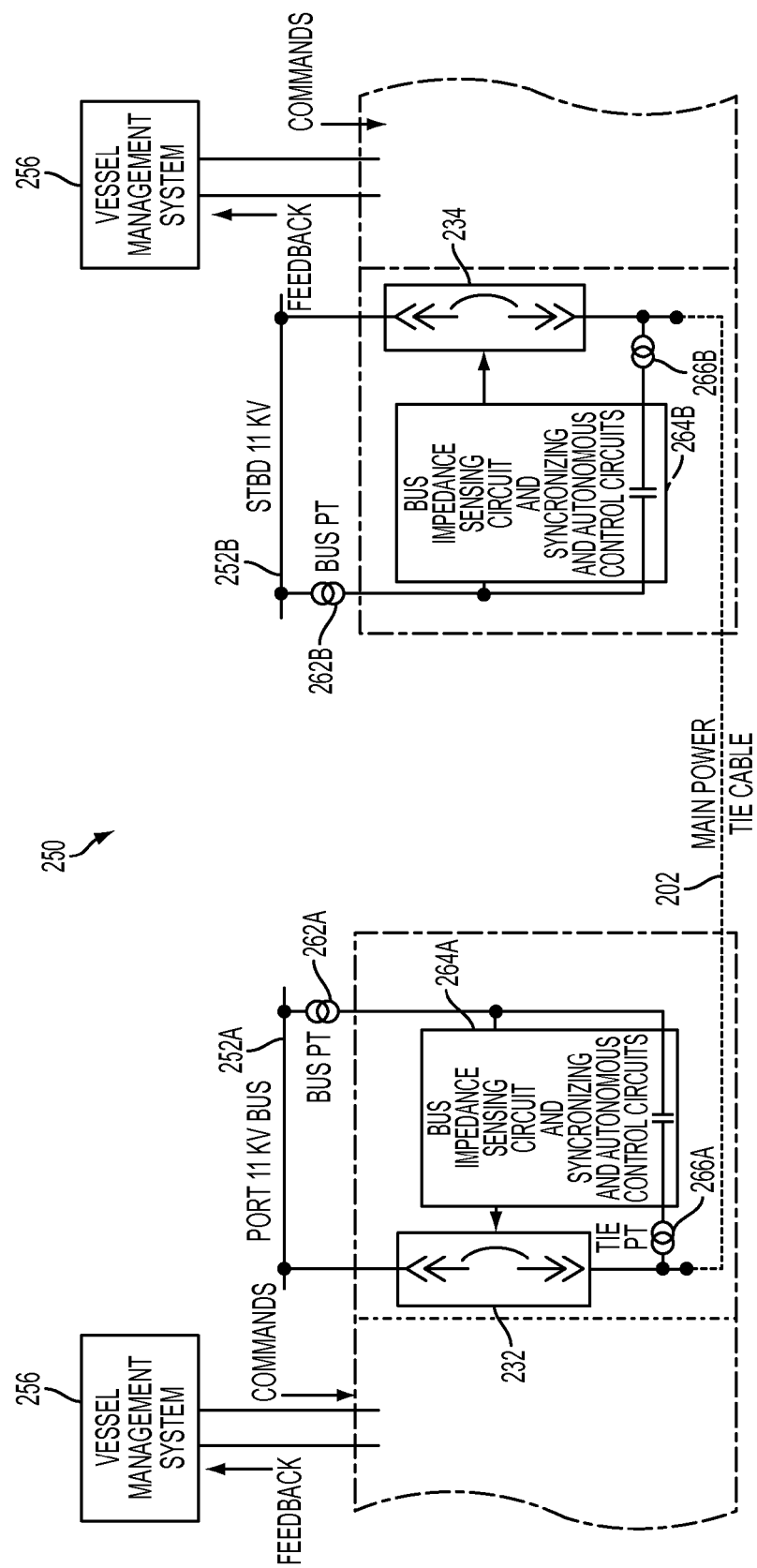
FIG. 2B is a schematic representation of a power system with independent breakers according to one embodiment of the disclosure.

FIG. 2B is a schematic representation of a power system with independent breakers according to one embodiment of the disclosure. The system may include a breaker 232 between a bus 252A and a main power bus 202. The breaker 232 may be controlled by autonomous tie control 264A, which may include bus impedance sensing circuitry and synchronizing circuitry. The control 264A may be integrated with the breaker 232 or operate as a separate component. The control 264A controls the breaker 232 to check a status of the health of the main power bus 202 before coupling the bus 252A to the main power bus 202. Current for testing the health of the main power bus 202 may be received through a bus point transformer 262A to a tie point transformer 266A.

A similar configuration may exist for the breaker 234 through autonomous tie control 264B coupled to bus point transformer 262B and tie point transformer 266B. In one embodiment, a vessel management system 256 may be used to instruct the breakers 232 and/or 234 to close to provide additional power to the main power bus 202, such as when additional power is desired. After the vessel management system 256 instructs the breakers 232 and/or 234 to close, the autonomous tie control 264 operates to determine a status of the main bus 202 and to decide whether to close the breakers 232, 234. In one embodiment, tie breakers 232, 234 may be used to couple a starboard bus and a port bus on a ship, such as a drilling rig.

Figure 3A:
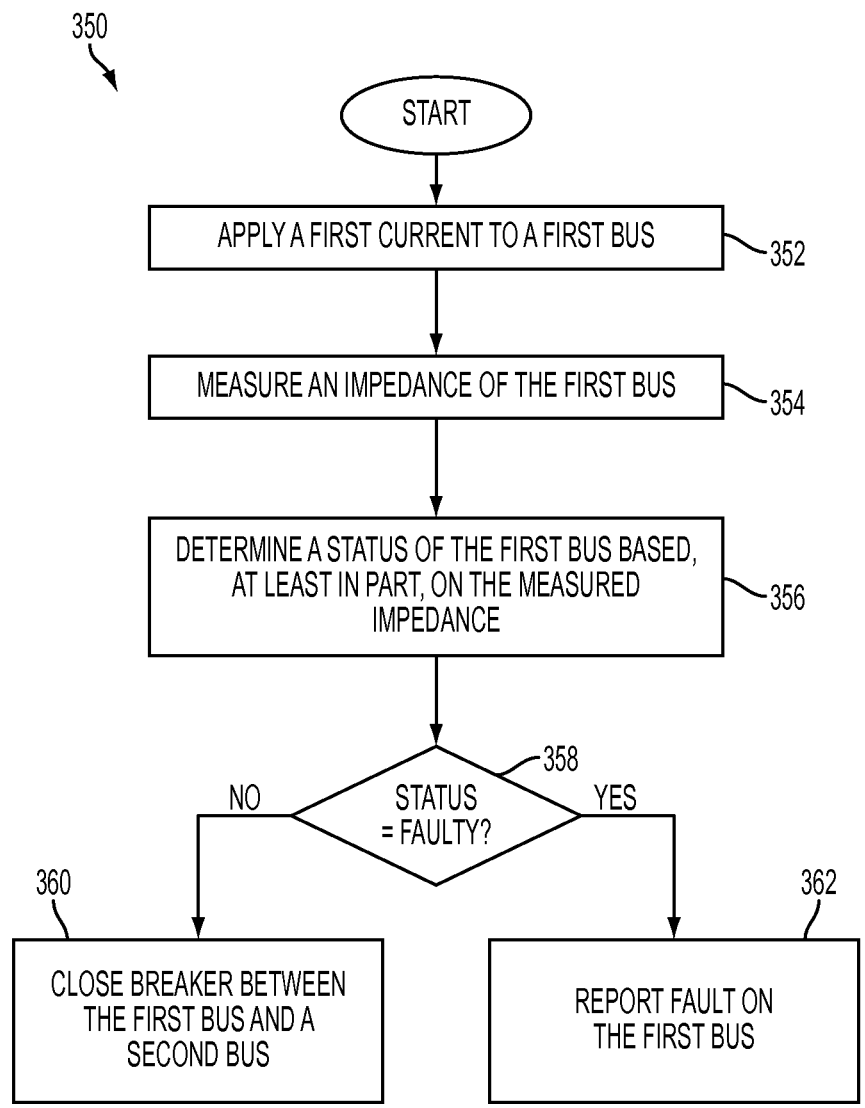
FIG. 3A is a flow chart illustrating a method for determining a status of a power bus with an independent breaker according to one embodiment of the disclosure.
Figure 3B:
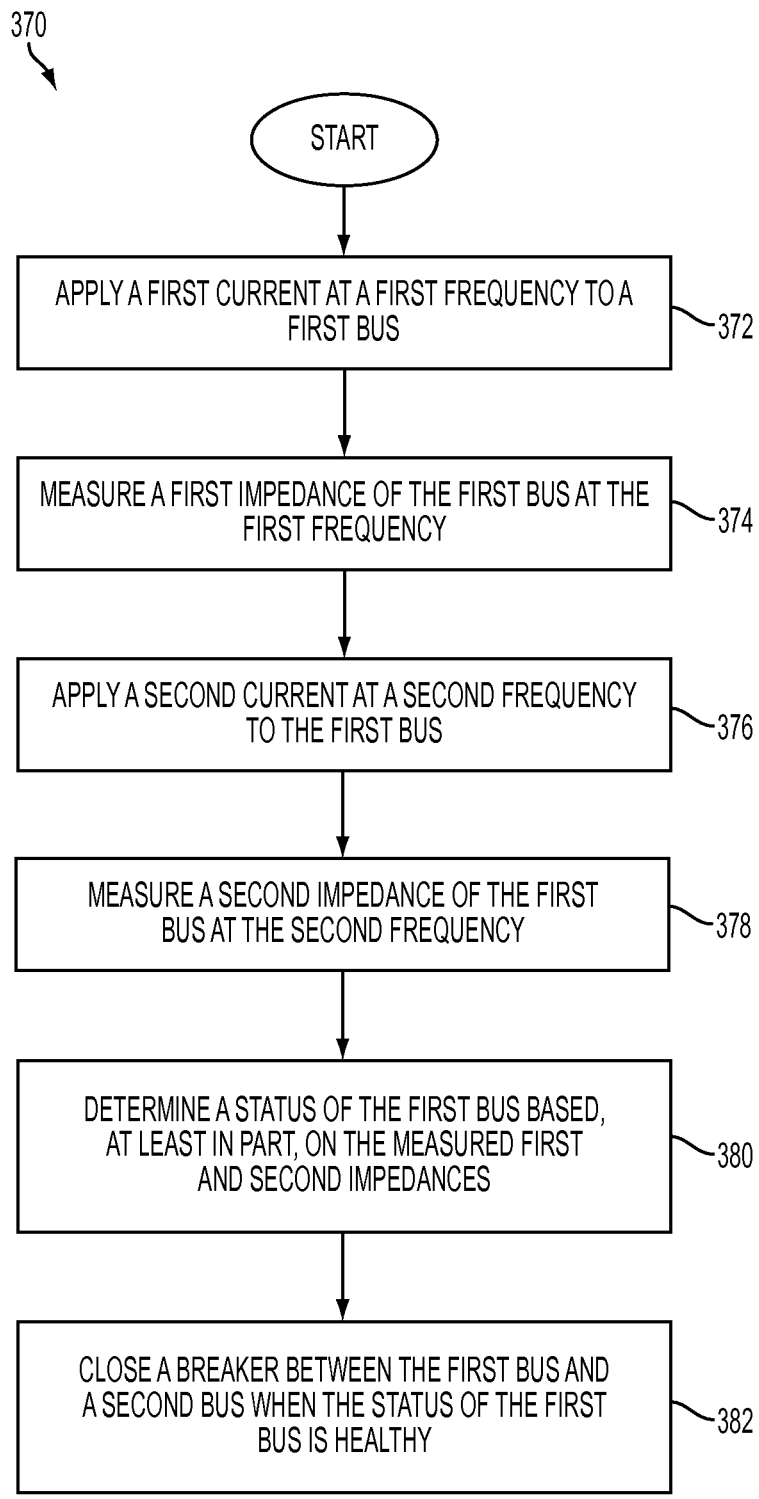
FIG. 3B is a flow chart illustrating a method for determining a status of a power bus by scanning multiple frequencies with an independent breaker according to one embodiment of the disclosure.
Figure 3C:
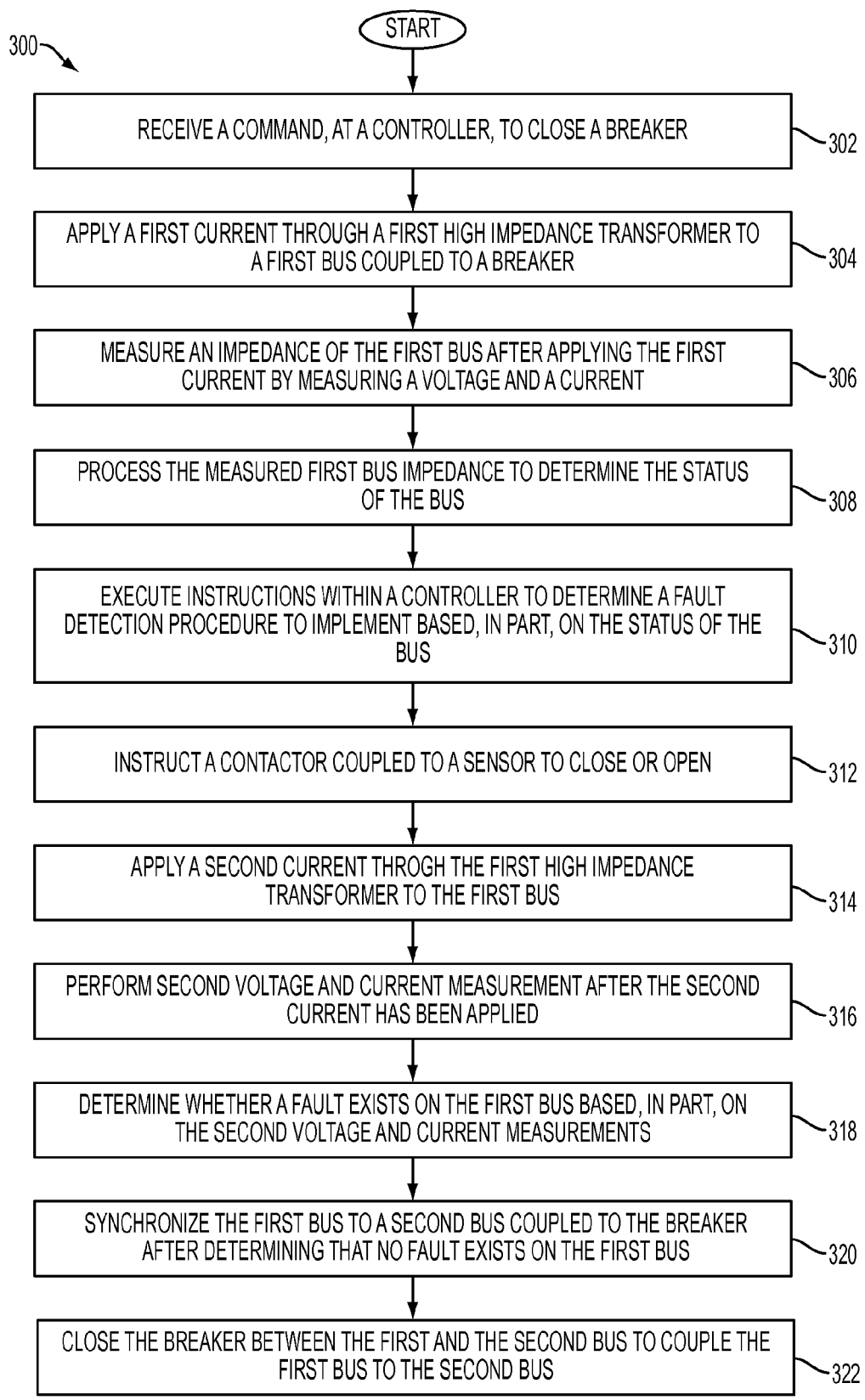
FIG. 3C is a flow chart illustrating a method for determining when it is safe to close a breaker according to one embodiment of the disclosure.

The autonomous tie control 264 may execute one of the methods illustrated in FIGS. 3A-C, although other methods may also be executed by control 264. FIG. 3A is a flow chart illustrating a method for determining a status of a power bus with an independent breaker according to one embodiment of the disclosure. A method 350 begins at block 352 with applying a first current to a first bus. Then, at block 354 an impedance of the first bus is measured with the first current. At block 356, a status of the first bus may be determined based, at least in part, on the measured impedance of block 354. If the status is determined to be faulty at block 358 then the method 350 proceeds to block 362 to report a fault on the first bus. The breaker may not be closed when a fault is detected. If the status is determined to be not faulty at block 358 then the method 350 proceeds to block 360 with closing the breaker between the first bus and the second bus.

The first current applied to the first bus may be received from second bus. The first current may also be manipulated before being applied to the first bus. For example, the current may be passed through a variable drive device to adjust a voltage and/or a frequency of the first current. The first bus may be tested through measurements of impedance across a range of voltages and/or frequencies to improve determination of the status of the first bus. FIG. 3B is a flow chart illustrating a method for determining a status of a power bus by scanning multiple frequencies with an independent breaker according to one embodiment of the disclosure. A method 370 begins at block 372 with applying a first current at a first frequency to a first bus. At block 374, a first impedance of the first bus is measured at the first frequency. At block 376, a second current is applied at a second frequency to the first bus. At block 378 a second impedance of the first bus is measured at the second frequency. Then, at block 380 a status of the first bus may be determined based, at least in part, on the measured first and second impedances of blocks 374 and 378. At block 382, a breaker between the first bus and the second bus may be closed when the status of the first bus is healthy.

FIG. 3C shows a flow chart illustrating a method 300 for determining when it is safe to close a breaker according to one embodiment. The method 300 begins at block 302 with a breaker receiving a command, at a controller, to close a breaker. In one embodiment, the close command can be a digital signal generated when a momentary dry contact is made in an offshore drilling vessel's management system to signal the breaker to initiate a close sequence. Excitation to the dry contact can be provided by the breaker. The excitation can be a pulsed output from the vessel management system to the breaker. The signal received can originate locally, such as within the breaker of FIG. 2. The signal can also originate remotely, such as at a management system external to the breaker, and be transmitted to the breaker via a communication link between the management system and the breaker. The signal received can be generated either automatically within the breaker or the management system, or the signal can be generated manually by an operator of the breaker. In one embodiment, the close signal can be generated when there is a need for more power on the bus. The status of a bus, or multiple buses, coupled to the breaker can be checked at blocks 304, 306, 308, and 310 after receiving a command to close the breaker at block 302.

At block 304, a first current can be applied through a first high impedance transformer to a first bus coupled to a breaker. In certain embodiments, two currents can be applied through two high impedance transformers to two buses coupled to the breaker. The number of currents that can be applied by a breaker to buses coupled to a specific breaker is not limited to one or two buses. For example, four currents can be applied through four high impedance transformers to four buses coupled to the breaker.

Although a high impedance transformer is described above, currents can be applied by the breaker to multiple buses through devices other than high impedance transformers. For example, currents can be applied to the buses through networks of capacitors, inductors, or combination of capacitors and inductors. These networks can be configured as matching networks that perform similar to a transformer by converting voltage and/or current from one port to another port depending on the configuration of the capacitors, inductors, or combination of capacitors and inductors. As another example, currents can be applied to the buses through transmission lines that present a high impedance to the buses.

At block 306, the impedance of the first bus can be measured after applying the first current by measuring a voltage and/or a current. A universal measuring transducer can perform the measurement at block 306. The impedance of a plurality of buses to which currents have been applied can also be measured with one or more devices that can measure the voltage and/or current of a bus.

At block 308, the first bus impedance can be processed to determine the status of the first bus. The status of the first bus can be represented by a Boolean indicator indicating whether the bus is dead or alive. In an embodiment, a controller can be used to perform the processing disclosed at block 308. In determining whether a bus is dead or alive, a bus may be considered dead if no signal exists on the bus, and the bus may be considered alive if a signal exists on the bus. The impedance of multiple buses can be processed by one or more controllers to determine the status of each of the buses.

At block 310, a fault detection procedure, such as a collision detection procedure, can be selected based, in part, on the status of the first bus. The fault detection procedure can ensure that no high energy collision occurs on the bus when the breaker closes. In an embodiment with two buses coupled to the breaker, there can be three distinct fault detection procedures. A first fault detection procedure can be executed when both buses are dead. A second fault detection procedure can be executed when both buses are live. A third fault detection procedure can be executed when one bus is dead and one bus is live. The number of fault detection procedures available can vary by application.

The implementation of a selected fault detection procedure can begin at block 312, when a contactor coupled to a sensor is instructed to close or open. In an embodiment, the contactor can also be coupled to either current sensors, voltage sensors, or both current and voltage sensors to allow for the measuring of voltage and/or current of a bus.

As one example with two buses coupled to a breaker, if the determined status of a first and second bus coupled to a breaker is that both buses are dead, then the contactor coupled to the first bus can be instructed to close while the contactor coupled to the second bus can be instructed to open. As another example with two buses coupled to a breaker, if the determined status of a first and second bus coupled to a breaker is that both buses are live, then the contactor coupled to the first bus and the contactor coupled to the second bus can both be instructed to open. In general, separate fault detection procedures can be selected depending on whether both buses are dead, both are live, or one bus is live and one bus is dead.

At block 314, a second current can be applied through the first high impedance transformer to the first bus. As described at block 304, several currents can be applied through several high impedance transformers.

At block 316, a voltage and/or current measurement can be obtained after the second current has been applied. In one embodiment, a universal measuring transducer can perform the measurements disclosed at block 316.

At block 318, it is determined whether a fault exists on the first bus based, in part, on the second voltage and/or current measurement. In one embodiment, determining whether a fault was detected can be performed by the same device, such as a controller, that determined the status of the bus at block 308. The controller can also process the measurements to determine whether a fault exists on the buses, such as rounding or averaging measurements. In certain embodiments, a fault can occur in the breaker. In such an embodiment, a digital signal, representing the breaker fault signal, can be sent to a vessel management system.

At block 320, the first bus can be synchronized to a second bus, also coupled to the breaker, if it was determined at block 318 that no fault exists. The synchronization of the buses can be performed automatically or manually. In performing the synchronization automatically, a synchronizer, such as a Woodward SPM-D Synchronizer, can perform synchronization without an operator manually biasing the generators. In another embodiment, the synchronization can be performed manually through the use of a sync check relay, also referred to as a synchroscope, that allows an operator to manually bias generators coupled to the breaker. According to one embodiment, the first bus can be synchronized to a plurality of buses also coupled to the breaker.

At block 322, the breaker between the first and second buses can be closed. Thus, the first bus is coupled to the second bus. In an embodiment, this can comprise coupling a generator to a load on a drilling vessel. In another embodiment, the first bus can be coupled to a plurality of buses also coupled to the breaker.

The method described in FIG. 3C can assume that all other signals that allow for the closing of a breaker permit the breaker to close. The breaker may not close if other signals indicate faults that can prevent the breaker from functioning correctly. These signals can include a signal indicating that the synchronizer is powered up and healthy and a signal indicating that a spring drive motor is charged.

According to an embodiment, there can exist a plurality of fault detection procedures that can be implemented to determine whether a fault exists on a bus as specified at block 310. Each procedure can perform the actions at blocks 312 through 322 of FIG. 3 in a different order based on the status of the first bus or the status of a plurality of buses identified at block 310. The order in which the actions at blocks 312 through 322 of FIG. 3 are performed can signify the specific fault detection procedure being implemented. For example, after two separate currents through two separate high impedance transformers to two buses coupled to the breaker have been applied, the breaker can determine that both buses are dead at block 310. In this case, the breaker can begin the implementation of the selected fault detection procedure at block 312 by instructing, by a controller, a contactor coupled to one high impedance transformer to open and instructing, by a controller, a contactor coupled to the other high impedance transformer to close. However, if it is determined that both buses are live, then the breaker can begin the implementation of the selected fault detection procedure at block 312 with both contactors coupled to each of the high impedance transformers open. Hence, the actions in other blocks can be performed in different order with different instructions based on the determined status of a bus or a plurality of buses at block 310.

Figure 3D:
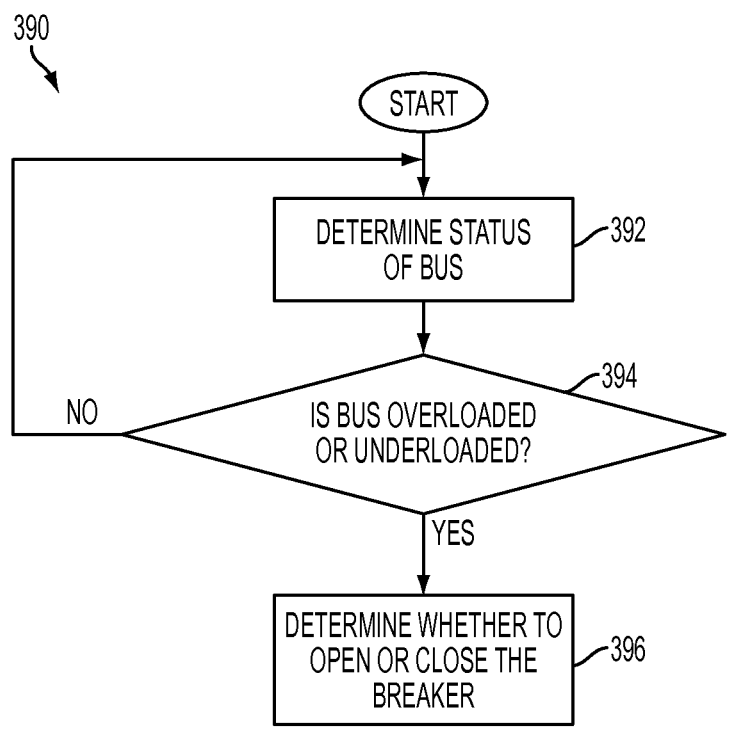
FIG. 3D shows a flow chart illustrating a method for determining whether to open or close a breaker according to one embodiment of the disclosure.

The breakers may decide autonomously whether to open or close based on conditions other than whether a bus is faulty. For example, the breakers may also determine another type of status of the bus, such as whether the bus is overloaded or under-loaded. FIG. 3D shows a flow chart illustrating a method 390 for determining whether to open or close a breaker according to one embodiment of the disclosure. A method 390 begins at block 392 with determining a status of a bus. The status of the bus may include measuring voltages, currents, frequencies, bus resonances, and/or other characteristics of the bus to determine electrical failures or electrical conditions of the bus. For example, variations in the bus frequency may indicate a load level on the bus, such that lower frequencies (e.g., 59 Hz when an optimal frequency is 60 Hz) indicates an overloaded bus. At block 394 it is determined whether the bus is overloaded or under-loaded. If the bus is overloaded or under-loaded, then the method 390 proceeds to determine whether to open or close the breaker. For example, when the bus is overloaded, the breaker may be opened to detach a generator from the main bus or close, to allow the generator to contribute energy to remove the overload. Other blocks may include detection of electrical faults such has high harmonic distortion, high or low voltage, high or low fundamental frequency or bus resonance. The local controller will take action based in status and timing to correct the electrical condition or to segregate the two buses to limit the fault condition to only one bus. These measurements can detect insulation failure and breaker failure (such as one or more poles failing to conduct not conduct as commanded.

The schematic flow chart diagrams of FIG. 3A, FIG. 3B, FIG. 3C are generally set forth as a flow chart diagram. As such, the depicted order and labeled steps are indicative of one embodiment of the presented method. Other steps and methods can be conceived that are equivalent in function, logic, or effect to one or more steps, or portions thereof, of the illustrated method. Additionally, the format and symbols employed are provided to explain the logical steps of the method and are understood not to limit the scope of the method. Additionally, the order in which a particular method occurs may or may not strictly adhere to the order of the corresponding steps shown.

Figure 4:
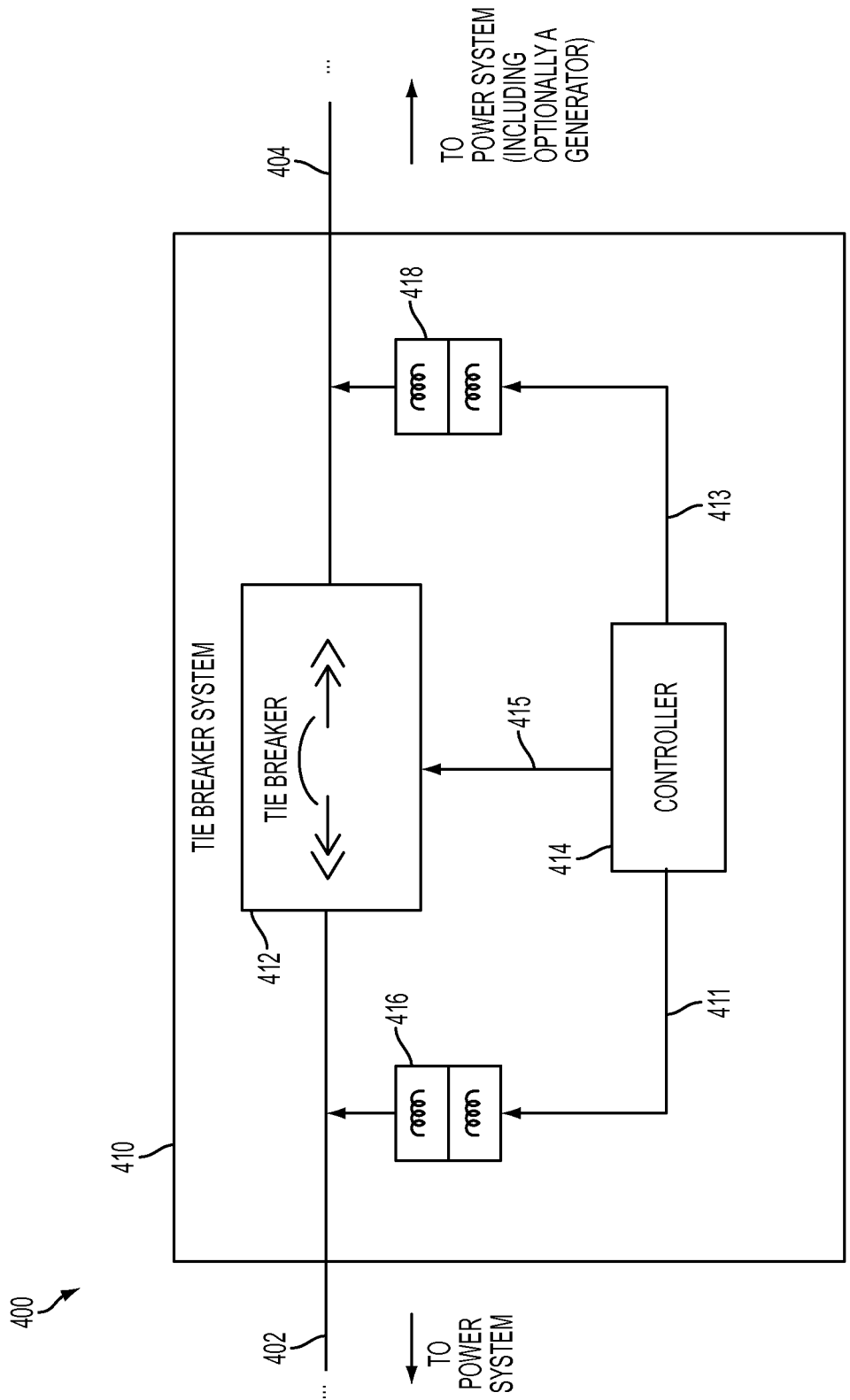
FIG. 4 is a schematic representation of a breaker with autonomous behavior according to one embodiment of the disclosure.

FIG. 4 shows an embodiment 400 of a breaker 410 with autonomous behavior. The breaker 410 can be used to determine when to close a contactor 412, and therefore couple a main power distribution bus 402 to a generator bus 404. In one embodiment, a breaker can be a Siemens NXPLUS-C Medium Voltage breaker section rated at 2000A. A breaker 410 can be equipped with voltage inputs 411, 413 coupled to the main bus 402 and the generator bus 404, respectively, through potential transformers 416, 418, respectively. The potential transformers 416, 418 can be coupled to the controller 414 and used to sense a bus voltage of the main bus 402 and the generator bus 404, respectively. The controller 414 can control the potential transformers 416, 418 to obtain a voltage measurement of the main bus 402 or the generator bus 404. For example, the controller 414 can process the voltage measurements and communicate via a communication link 415 to the contactor 412. The controller 414 can also be configured to perform the following actions: apply a current to the buses 402, 404 coupled to the contactor 412; measure an impedance of the buses 402, 404 after applying a current; and/or determine if a fault exists on the buses 402, 404. In one embodiment, the controller can be a Siemens SIMOCODE controller.

According to an embodiment, the controller 414 can be further configured to control the breaker 410 autonomously, and manage control commands. The controller 414 can also be configured to monitor and control the status of switchgear (not shown), and to determine the availability and status of the contactor 412. The switchgear can be a combination of electrical disconnect switches, fuses, or circuit breakers used to control, protect, and/or isolate electrical equipment. Moreover, the controller 414 can be configured to control the process by which potential transformers 416, 418 are coupled, and can be configured to monitor voltage and current existing on a bridge between potential transformers 416, 418. It should be understood that the controller 414 can be configured to perform various other actions, and its functionality should not be limited in scope to the actions described within this disclosure. Furthermore, other actions can be conceived that are equivalent in function, logic, or portions thereof, of the actions the controller disclosed here is configured to perform.

According to one embodiment, the breaker 410 can be part of an offshore vessel distribution system. The breaker 410 can synchronize two independent buses by performing measurements on the contactor 412 and providing speed bias signals to generators. The breaker 410 can also open a contactor 412 to segregate the vessel's power sources due to an electrical fault.

Figure 5:
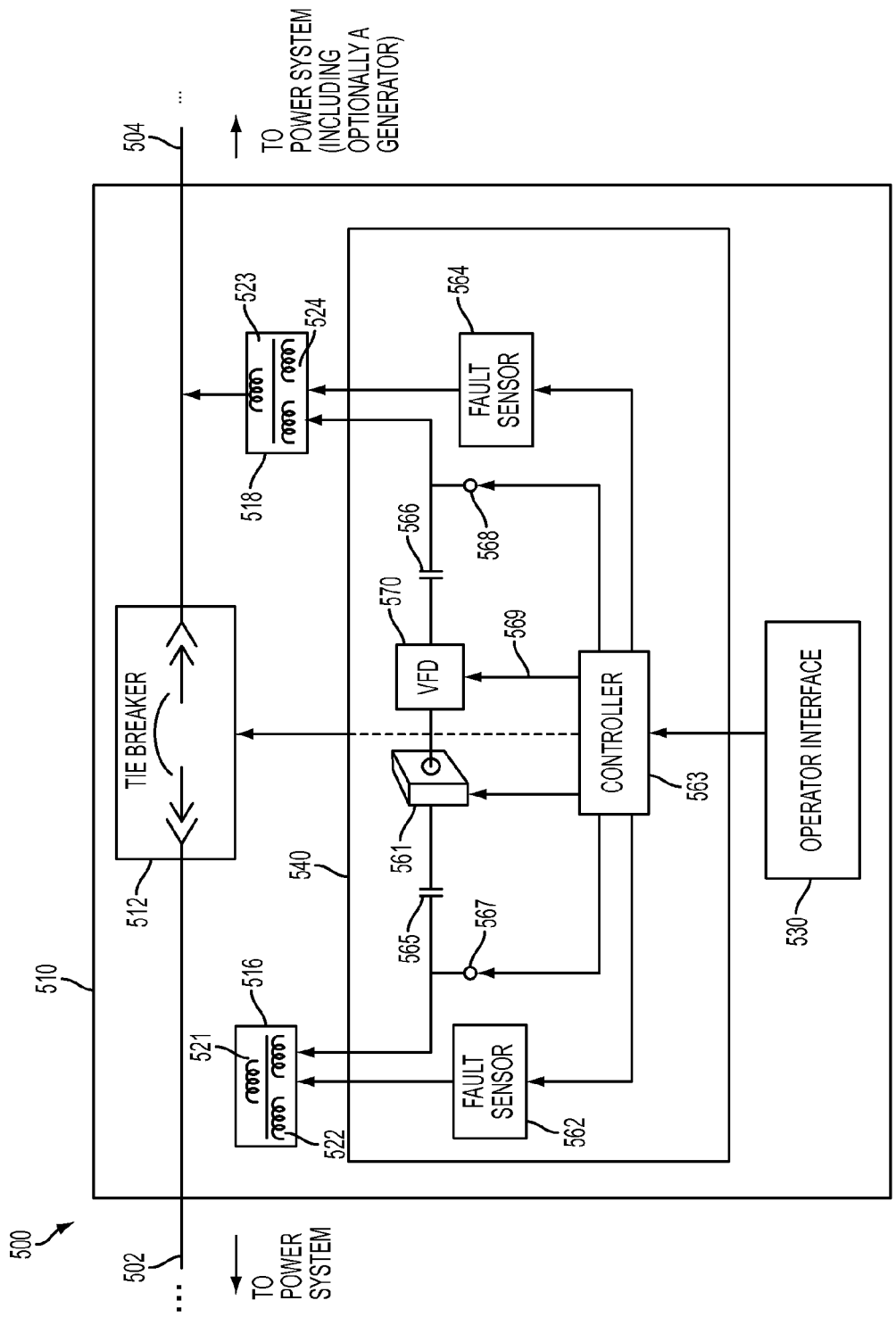
FIG. 5 is a schematic representation of a breaker with additional sensors according to one embodiment of the disclosure.

FIG. 5 shows an embodiment 500 of a breaker 510. The breaker 510 can include a breaker 512 coupled to a main bus 502 on one end and to a generator bus 504 on another end. In an embodiment, the breaker 510 can be used to determine when to close a breaker 512 to couple the main bus 502 and the generator bus 504.

In an embodiment, the breaker 510 can have a potential transformer 516 coupled between the main bus 502 and the control circuit 540. Another potential transformer 518 can be coupled between the generator bus 504 and the control circuit 540. The inner circuitry of the control circuit 540 can include a controller 563. The potential transformers 516, 518 can provide protection to the control circuit 540 from the buses 502, 504 by presenting a high impedance to the buses 502, 504, and therefore attenuating any high energy fault that can occur on the buses 502, 504. The breaker 510 can direct a collision through the high impedance potential transformers 516, 518 rather than the buses 502, 504. The high impedance potential transformers 516, 518 can also be used by the breaker 510 to assist in the sensing of a bus voltage.

The potential transformers 516, 518 can include primary bus potential transformers 521, 523, respectively, and secondary potential transformers 522, 524, respectively. The secondary potential transformers 522, 524 can be arranged in a broken delta configuration with a burden resistor (not shown). The potential transformers 521, 523 can be used to sense a bus voltage, for the purposes of synchronization, and/or to detect a dead or live bus. As another example, the potential transformers 521, 523 can also energize a bus during the impedance sensing process prior to closing the breaker 512. Furthermore, the potential transformers 521, 523 can detect ground faults on the buses 502, 504, respectively. In an embodiment, the secondary set of potential transformers 522, 524 can be used to detect a dead bus condition on the buses 502, 504.

The high impedance potential transformers 516, 518 can be coupled to the controller 563 within the control circuit 540 through other devices, sensors, switches, and/or relays. For example, the high potential transformers 516, 518 can be coupled to the controller 563 through fault sensors 562, 564, respectively. The fault sensors 562, 564 and secondary potential transformers 522, 524 can be used to by the controller 563 to determine if there exists a fault on either bus 502, 504. In another example, the high impedance potential transformers 516, 518 can be coupled to the controller 563 through dead bus relays 567, 568, respectively, which can detect whether the bus 502, 504 coupled through a potential transformer 516, 518 is dead or alive. In a further example, the high impedance potential transformers 516, 518 can be coupled to the controller 563 through contactors 565, 566, voltage sensors 569, and current sensors 561. According to this arrangement, the controller 563 can measure a voltage and/or a current. The voltage and/or current measurements can be used to determine a fault detection procedure to implement or for determining if a fault exists on a bus 502, 504. Further, a variable frequency drive (VFD) 570 may be used to manipulate a current passed between the transformers 516, 518.

In an embodiment, the breaker 510 can also have protection circuitry (not shown) within the control circuit 540. The protection circuitry can trip the breaker 512 under fault conditions determined elsewhere, such as in a generator protection system (not shown).

The breaker 510 can further include a synchronizer (not shown) within the control circuit 540. The synchronizer can be used to synchronize two independent AC power sources, such as generators, and allow a breaker between two live buses to close. In an embodiment the synchronizer can synchronize two isolated buses, 502, 504, using a bias signal applied to one of the power sources. After the synchronizer detects that the two isolated buses 502, 504 are appropriately synchronized, the synchronizer can issue a signal allowing the contactor 512 in the breaker 510 to close. In an embodiment, the synchronizer, such as a Woodward SPM-D Synchronizer, allows the synchronization of the buses to be performed automatically without the aid of manual biasing of power sources by an operator.

The breaker 510 can also include a sync check relay (not shown) within the control circuit 540. The sync check relay, such as a synchroscope, graphically displays the phase difference between two unsynchronized sources and issues a signal when the sources have been appropriately synchronized, thus allowing the breaker to be closed. The sync check relay can be a passive device that allows the synchronization of the buses to be performed manually through the use of a sync potentiometer to bias the power source coupled to one of the isolated buses.

The breaker 510 can further include a universal measuring transducer (not shown) within the control circuit 540. The universal measuring transducer can determine the electrical parameters of the contactor 512 and report the parameters to the management system via the operator interface 530. Bus parameters that can be processed using the universal measuring transducer include a voltage, current, frequency, real and reactive power, and a power factor.

Figure 6:
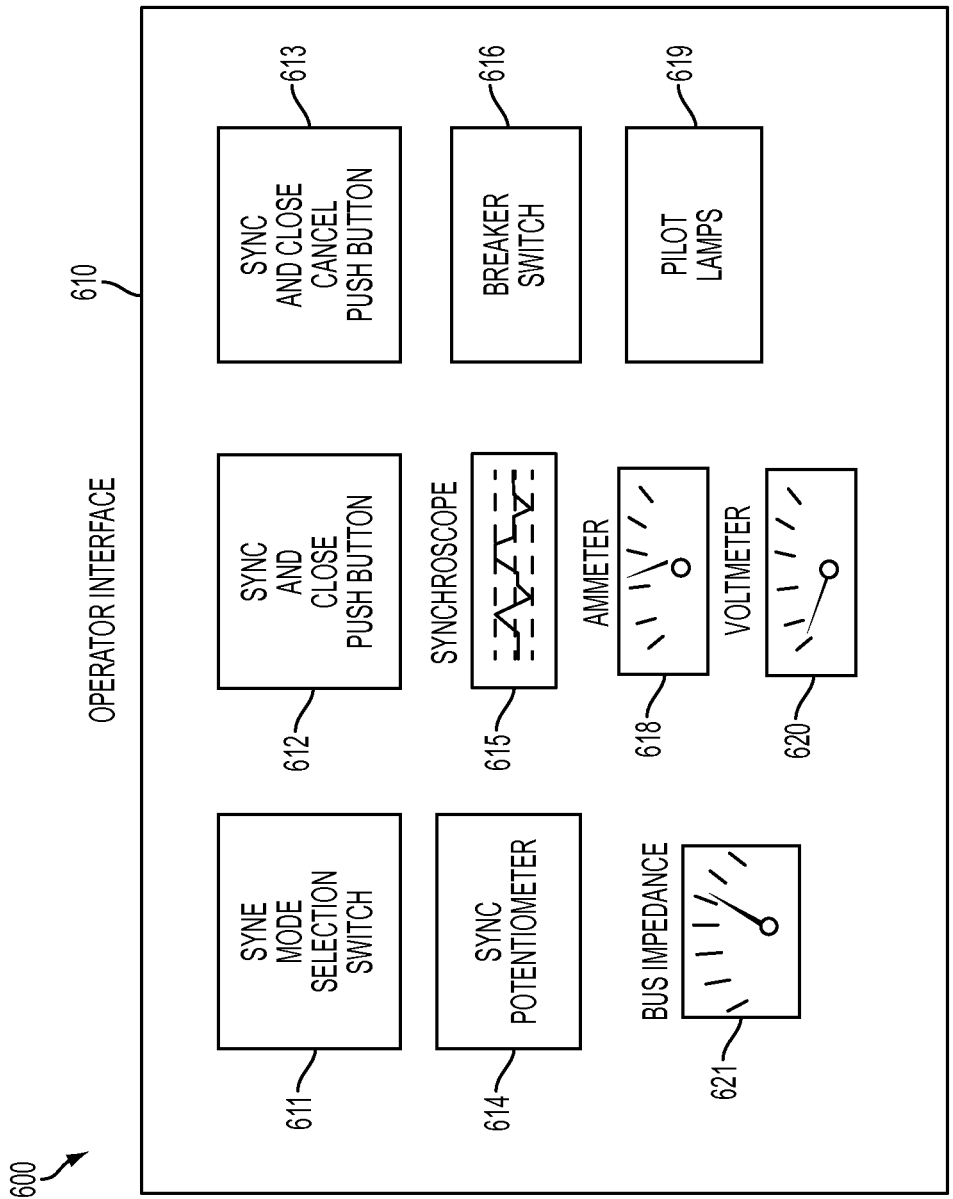
FIG. 6 is a schematic representation of an operator interface according to one embodiment of the disclosure.

The breaker 510 can also include an operator interface 530 in an embodiment. The operator interface can include an output device, such as a monitor display, and an input device, such as a keyboard, to allow an administrator to monitor and control a power system. FIG. 6 shows an embodiment 600 of the operator interface 530 of FIG. 5. The operator interface 610 can include a sync mode selection switch 611. The sync mode selection switch 611 can allow the breaker to toggle between being operated remotely or locally and also between being operated automatically or manually. Furthermore, the breaker can have a network interface coupled to the controller, in which the controller is further configured to allow remote access to the operator interface. The network interface can include a connection to a propriety bus or signaling system or a connection to a public network, such as the Internet.

In an embodiment, the operator interface 610 within the breaker can also include a sync and close pushbutton 612. The sync and close pushbutton 612 can initiate a sync and close operation within the breaker. The resulting sync and close operation initiated can be an automated process that uses a synchronizer (not shown) to bias isolated power sources automatically. In certain embodiments, the synchronizer can be coupled to the controller that provides instruction to the synchronizer and an external power source to bias. The operator interface 610 can also include a sync and close cancel pushbutton 613 to cancel the sync and close operation initiated by the sync and close pushbutton 612. The operator interface 610 can further include a sync potentiometer 614 to bias the speeds of a generator on a tie bus. The operator interface 610 can also include a synchroscope 615 to measure and display the phase angle difference between the two sides of a breaker. The sync potentiometer 614 can be adjusted until the phase, as indicated in the synchroscope 615, is matched across an open breaker. The operator interface 610 can further include a breaker switch 616 to provide direct control of the breaker. In an embodiment, the switch can be a three-position, spring return to center. The breaker switch 616 can be used to open the breaker at any time.

The operator interface 610 can also include an ammeter 618 to display the current through the breaker, a voltmeter 620 to show a voltage across the breaker, and/or an impedance meter 621 to show bus impedance. Furthermore, the operator interface 610 can include pilot lamps 619 to provide the status of the breaker 412, 512. In an embodiment, the operator interface 610 disclosed here can be accessed locally or remotely. For example, the operator interface 610 can be a door on which all the features described in FIG. 6, as well as others, are available for manual local control. As another example, the operator interface 610 can be an offshore drilling vessel's management system that provides instruction to the breaker remotely.

Figure 7:
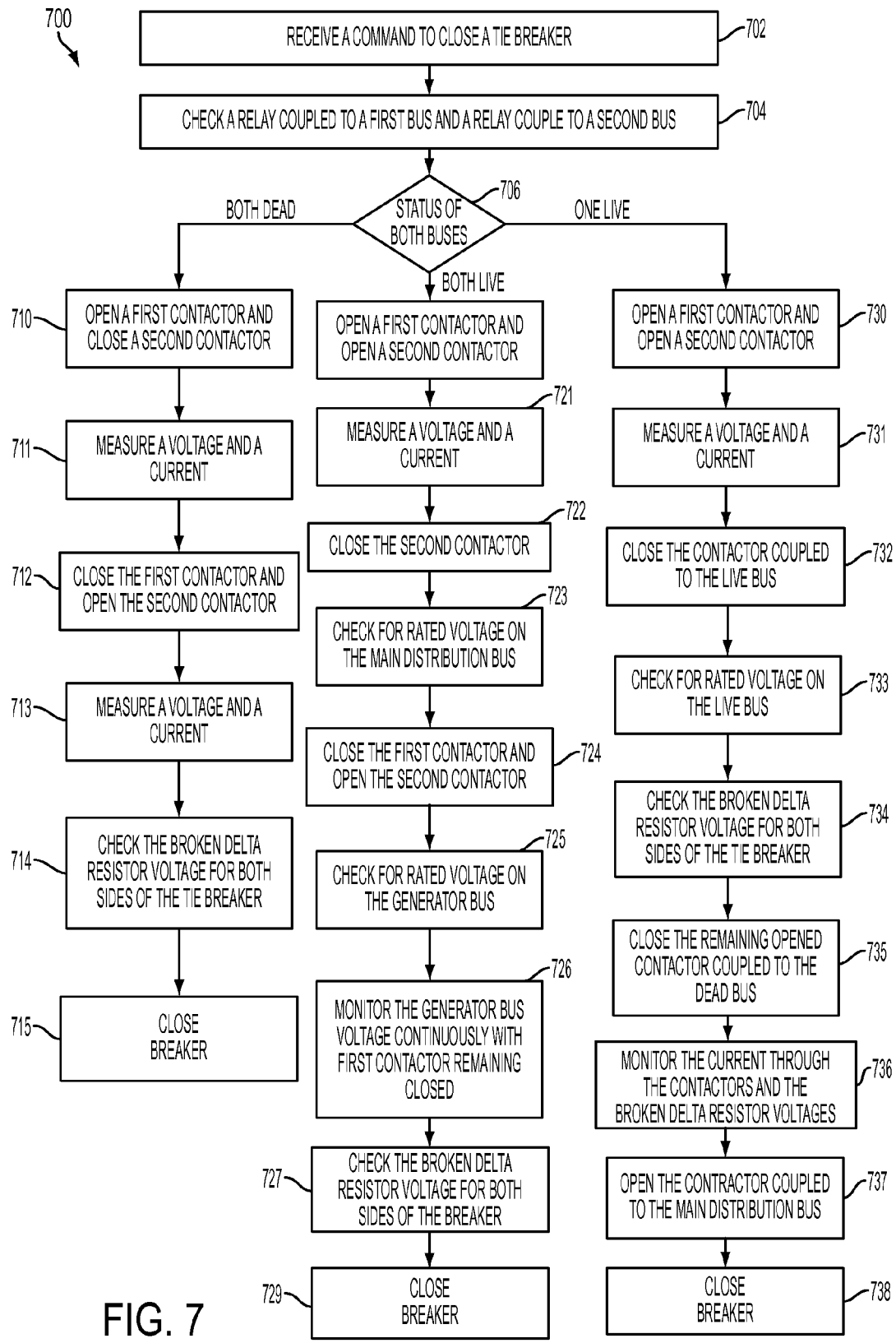
FIG. 7 is a flow chart illustrating an embodiment of a method for determining when to close a breaker.

FIG. 7 shows a flow chart illustrating a method 700 for determining when to close a breaker according to an embodiment. In this embodiment, a breaker can have a breaker coupled to a first and second bus. Furthermore, the first bus can be a generator bus and the second bus can be a main distribution bus in this embodiment. The method 700 begins at block 702 with a breaker receiving a command, at a controller, to close a breaker. At block 704 a relay coupled to a first bus and a relay coupled to the second bus can be checked to determine whether the first and second buses are dead or alive. According to an embodiment, checking relays coupled to the first and second buses to determine whether the buses are dead or alive can include applying currents through high impedance transformers to the first and second buses coupled to the breaker. After applying the currents, the impedance of the buses can then be measured by measuring a voltage and a current.

At block 706, the measured impedances can be processed to determine the status of the buses. In this embodiment, the bus status can be whether a bus is dead or alive. Furthermore, at block 706, a controller can select a fault detection procedure to implement based, in part, on the status of the buses. In an embodiment, there can be three distinct fault detection procedures. A first fault detection procedure can be executed when both buses are dead. A second fault detection procedure can be executed when both buses are live. A third fault detection procedure can be executed when one bus is dead and one bus is live.

In one embodiment, if the controller determines at block 706 that both buses are dead, then the method proceeds to block 710 to instruct a first contactor to open and a second contactor to close. At block 711, a second voltage and current measurement can be performed after the contactors open or close as instructed at block 710. A second current can be applied through the high impedance transformers to the first and second buses coupled to the breaker in order to make the second voltage and current measurements. The voltage and current measured at block 711 can be processed to determine whether a fault exists on either the first or second bus. In one embodiment, the voltage and current measured at block 711 may be approximately zero for the breaker to close.

At block 712, the first contactor can be instructed to close and the second contactor can be instructed to open. At block 713, a third voltage and current measurement can be performed after the contactors open or close as instructed at block 712. A third current can be applied through the high impedance transformers to the first and second buses coupled to the breaker in order to make the third voltage and current measurements. The voltage and current measured at block 713 can be processed to determine whether a fault exists on either the first or second bus. In one embodiment, the voltage and current measured at block 713 may be approximately zero for the breaker to close.

At block 714, the broken delta resistor voltage on both the main first and second bus can be checked by reading the voltage of secondary potential transformers arranged in a broken delta configuration with a burden resistor as shown in FIG. 5. The checking of the voltage of the broken delta resistors can also be used to determine whether a fault exists on either the first or second bus. In an embodiment, the voltages of the broken delta resistors may be approximately zero for the breaker to close. Then, at block 715 the breaker is closed.

Optionally, if it is determined at block 714 that no fault exists on either the first or second bus, then a signal can be transmitted to a synchronizer (not shown) instructing the synchronizer to synchronize the first and second bus coupled to the breaker. The breaker between the first and second buses can then be closed to couple the two buses to each other. In the case that a fault is detected, the breaker may not close. Furthermore, the breaker can open, if previously closed, when a fault is detected. In one embodiment, the command to open can be a digital signal generated when a momentary dry contact is made in an offshore drilling vessel's management system to signal the breaker to open. According to the embodiment, excitation to the dry contact is provided by the breaker. The excitation can be a pulsed output from the vessel management system to the breaker.

In another embodiment, if the controller determines at block 706 that both buses are live, then the method proceeds to block 720, wherein a first contactor can be instructed to open and a second contactor can also be instructed to open. At block 721, a second voltage and current measurement can be performed after the contactors open as instructed at block 720. A second current can be applied through the high impedance transformers to the first and second buses coupled to the breaker in order to perform the second voltage and current measurements. The voltage and current measured at block 721 can be processed to determine whether a fault exists on either the first or second bus. In one embodiment, the voltage and current measured at block 721 may be approximately zero for the breaker to close.

At block 722, the second contactor can be instructed to close. At block 723, the voltage on the second bus can be checked after the second contactor closes as instructed at block 722. The current can also be measured while the voltage of the second bus is checked. A third current can be applied through the high impedance transformers to the first and second buses coupled to the breaker in order to check the voltage of the second bus and measure a current. The voltage and current measured at block 723 can be processed to determine whether a fault exists on the second bus. In one embodiment, the current measured at block 723 may be approximately zero for the breaker to close.

At block 724, the first contactor can be instructed to close and the second contactor can be instructed to open. At block 725, the voltage on the first bus can be checked after the contactors open or close as instructed at block 724. The current can also be measured while the voltage of the first bus is checked. A fourth current can be applied through the high impedance transformers to the first and second buses coupled to the breaker in order to check the voltage of the first bus and measure a current. The voltage and current measured at block 725 can be processed to determine whether a fault exists on the first bus. In one embodiment, the current measured at block 725 must be zero if a breaker is to ultimately determine that the breaker should close. In one embodiment, the current measured at block 725 may be approximately zero for the breaker to close.

At block 726, the first bus voltage can be monitored with the first contractor remaining closed. At block 727, the broken delta resistor voltage on both the first and the second bus can be checked by reading the voltage of secondary potential transformers arranged in a broken delta configuration with a burden resistor as described with reference to FIG. 5. The checking of the voltage of the broken delta resistors can also determine whether a fault exists on either the first or second bus. In an embodiment, the voltages of the broken delta resistors may be approximately zero for the breaker to close. Then, at block 729 the breaker may be closed.

Optionally, if it is determined at block 727 that no fault exists on either the first or second bus, then a signal can be transmitted to a synchronizer instructing the synchronizer to synchronize the first and second bus coupled to the breaker. The breaker between the first and second buses can then be closed to couple the two buses. In the case that a fault is detected, the breaker may not close. Furthermore, the breaker can open, if previously closed, when a fault is detected. In one embodiment, the command to open can be a digital signal generated when a momentary dry contact is made in an offshore drilling vessel's management system to signal the breaker to open. According to the embodiment, excitation to the dry contact is provided by the breaker. The excitation can be a pulsed output from the vessel management system to the breaker.

In another embodiment, if the controller determines at block 706 that one bus is dead and one bus is live, then the method proceeds to block 730, where a first contactor can be instructed to open and a second contactor can also be instructed to open. At block 731, a second voltage and current measurement can be performed after the contactors open at block 730. A second current can be applied through the high impedance transformers to the first and second buses coupled to the breaker in order to make the second voltage and current measurements. The voltage and current measured at block 731 can be processed to determine whether a fault exists on either the first or second bus. In one embodiment, the voltage and current measured at block 731 may be approximately zero for the breaker to close.

At block 732, the contactor coupled to the live bus can be instructed to close. At block 733, the voltage on the live bus can be checked after the contactor coupled to the live bus closes as instructed at block 732. The current can also be measured while the voltage of the live bus is checked. A third current can be applied through the high impedance transformers to the first and second buses coupled to the breaker in order to check the voltage of the live bus and measure a current. The voltage and current measured at block 733 can be processed to determine whether a fault exists on the live bus. In one embodiment, the current measured at block 733 may be approximately zero for the breaker to close.

At block 734, the broken delta resistor voltage on both the first and second bus can be checked by reading the voltage of secondary potential transformers arranged in a broken delta configuration with a burden resistor as described with reference to FIG. 5. The checking of the voltage of the broken delta resistors can also be used to determine whether a fault exists on either the first or second bus. In an embodiment, the voltages of the broken delta resistors must be zero if the method is to ultimately determine that the breaker should close.

At block 735, the contactor coupled to the dead bus can be instructed to close. At block 736, the current through the closed contactors can be monitored, and the broken delta resistor voltage can also be monitored to check for faults.

In an embodiment, if an abnormal bus condition is detected then one of the contactors must be opened. The breaker may not be allowed to close if an abnormal condition is detected. The controller can wait a programmable time before attempting to close both of the contactors again. A single repeat of the process can be allowed. This can allow for the case where two ties might excite the bus coupling between them at exactly the same time, causing an abnormal reaction in a system that is fundamentally healthy. If the previously dead bus appears to respond normally to excitation through a transformer, then the excitation can be maintained for a short period of time while continuing to monitor the current through the contactors and the broken delta resistor voltages.

Optionally, if a fault has not been detected on either the first or second bus, then a signal can be transmitted to a synchronizer instructing the synchronizer to synchronize the first and second bus coupled to the breaker. The breaker between the first and second buses can then be closed to couple the two buses. In the case that a fault is detected, the breaker may not close. Furthermore, the breaker can open, if previously closed, when a fault is detected. In one embodiment, the command to open can be a digital signal generated when a momentary dry contact is made in an offshore drilling vessel's management system to signal the breaker to open. According to the embodiment, excitation to the dry contact is provided by the breaker. The excitation can be a pulsed output from the vessel management system to the breaker.

At block 737, after the breaker has been closed, the second contactor can be opened while the first contactor remains closed. Then, at block 738 the breaker may be closed.

If implemented in firmware and/or software, the functions described above, such as with described with reference to FIG. 3A, FIG. 3B, FIG. 3C, and FIG. 7 may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present processes, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
   energizing a first bus with a first AC power source;
   energizing a second bus with a second AC power source;
   applying, by a tie breaker system, a first current to the first energized bus coupled to a breaker between the first bus and the second bus while the breaker is open;
   measuring, by the tie breaker system, a first impedance of the first energized bus after applying the first current to the first energized bus;
   determining, by the tie breaker system, if a fault exists on the first energized bus based, at least in part, on the measured first impedance; and
   coupling, by the tie breaker system, the first energized bus to the second energized bus when no fault exists on the first energized bus by synchronizing AC energy on the first energized bus with AC energy on the second energized bus and closing the breaker between the first energized bus and the second energized bus, wherein the step of synchronizing AC energy comprises providing signals to at least one of the first power source energizing the first energized bus and the second power source energizing the second energized bus.

2. The method of claim 1, wherein applying a first current to a first bus comprises applying the first current through a transformer to the first bus.

3. The method of claim 1, further comprising:
   receiving a command, at a controller, to close the breaker before applying the first current; and
   instructing, by a controller, a contactor to close or open after measuring a first impedance.

4. The method of claim 1, wherein determining if a fault exists on the first bus comprises:
   determining a fault detection procedure to implement based, in part, on the measured first impedance of the first bus; and
   implementing the selected fault detection procedure.

5. The method of claim 1, wherein applying the first current comprises applying the first current at a first frequency, and the method further comprising:
   applying a second current at a second frequency; and
   measuring a second impedance of the first bus after applying the second current to the first bus, wherein the step of determining if a fault exists on the bus comprises determining if a fault exists based, at least in part, on the measured first impedance and the measured second impedance.

6. The method of claim 1, wherein the breaker comprises a tie breaker and the step of coupling the first bus to the second bus comprises coupling a generator to a load on a drilling vessel.

7. The method of claim 4, wherein determining a fault detection procedure comprises:
   processing the measured first impedance;
   determining the status of the first bus after processing the measured impedance; and
   selecting the fault detection procedure to implement based, in part, on the determined status of the first bus.

8. The method of claim 4, wherein implementing the selected fault detection procedure comprises:
   instructing a contactor to close or open;
   applying a second current to the first bus;
   measuring a second impedance of the first bus after applying the second current; and
   determining whether a fault exists on the first bus based, in part, on the second impedance.

9. An apparatus, comprising:
   a breaker coupled between a first bus and a second bus, wherein the first bus is energized with AC energy from a first AC power source and the second bus is energized with AC energy from a second AC power source;
   a controller coupled to the breaker;
   a synchronizer coupled to the first energized bus and an external power source on the second bus, wherein the synchronizer is configured to synchronize AC energy on the second energized bus with AC energy on the first energized bus, wherein the synchronizer is configured to provide signals to at least one of the first power source energizing the first energized bus and the second power source energizing the second energized bus to synchronize AC energy between the first energized bus and the second energized bus;
   a first potential transformer coupled to a controller and the first bus; and
   a second potential transformer coupled to the controller and the second bus, in which the controller is configured:
      to apply a first current from the second energized bus to the first energized bus while the breaker is open;
      to measure a first impedance of the first energized bus after applying the first current to the first energized bus;
      to determine if a fault exists on the first bus based, at least in part, on the measured first impedance; and
      when no fault is determined to exist, to activate the breaker and the synchronizer to synchronize and to couple the first energized bus to the second energized bus to supply AC energy from the second energized bus to the first energized bus.

10. The apparatus of claim 9, in which the first potential transformer comprises a primary transformer and secondary transformers in a broken delta configuration.

11. The apparatus of claim 9, further comprising:
a sensor for monitoring either a voltage, current, or both the voltage and current;
a first contactor coupled between the sensor and the first potential transformer; and
a second contactor coupled between the sensor and a second potential transformer.

12. The apparatus of claim 9, further comprising a first fault sensor coupled to the first potential transformer and the controller and a second fault sensor coupled to the second potential transformer and the controller.

13. The apparatus of claim 9, further comprising a first relay coupled to the first potential transformer and the controller and a second relay coupled to the second potential transformer and the controller.

14. The apparatus of claim 9, further comprising an operator interface coupled to the controller, in which the controller is further configured to manage control commands received from the operator interface.

15. The apparatus of claim 14, wherein the controller is further configured:
to apply a second current at a second frequency;
to measuring a second impedance of the first bus after applying the second current to the first bus; and
to determine if a fault exists on the bus based, at least in part, on the measured first impedance and the measured second impedance.

16. The apparatus of claim 14, in which the operator interface comprises:
a sync and close switch to initiate the synchronizing of the external power source;
a sync and close cancel switch to cancel the synchronizing of the external power source;
a sync potentiometer to bias the external power source; and
a synchroscope to display the phase difference between unsynchronized sources.

17. An apparatus, comprising:
a breaker coupled to a first energized bus energized with AC energy from a first AC power source and a second energized bus energized with AC energy from a second AC power source;
means for applying a first current to the first energized bus; and
a controller coupled to the first current applying means, in which the controller is configured:
to determine if a fault exists on the first energized bus while the breaker is open; and
to couple the first energized bus to the second energized bus through the breaker when no fault exists on the first bus by synchronizing AC energy on the first energized bus with AC energy on the second energized bus and closing the breaker between the first energized bus and the second energized bus, wherein the step of synchronizing AC energy comprises providing signals to at least one of the first power source energizing the first energized bus and the second power source energizing the second energized bus.

18. The apparatus of claim 17, further comprising:
a generator coupled to the second bus; and
a load coupled to the first bus,
in which the first bus is a main power bus and the second bus is a generator bus.

19. The apparatus of claim 17, further comprising means for applying a second current to the second bus, in which the second current applying means is coupled to the controller.

* * * * *